(12) United States Patent
Noguchi et al.

(10) Patent No.: US 7,763,151 B2
(45) Date of Patent: Jul. 27, 2010

(54) PROCESS FOR PRODUCING TRANSPARENT CONDUCTIVE LAMINATE

(75) Inventors: Tomonori Noguchi, Ibaraki (JP); Hidehiko Andou, Ibaraki (JP); Hidetoshi Yoshitake, Ibaraki (JP); Hideo Sugawara, Ibaraki (JP)

(73) Assignee: Nitto Denko Corporation, Osaka (JP)

( * ) Notice: Subject to any disclaimer, the term of this patent is extended or adjusted under 35 U.S.C. 154(b) by 1332 days.

(21) Appl. No.: 10/925,930

(22) Filed: Aug. 26, 2004

(65) Prior Publication Data

US 2005/0045471 A1 Mar. 3, 2005

(30) Foreign Application Priority Data

Aug. 29, 2003 (JP) .................. P. 2003-306586

(51) Int. Cl.
*C23C 14/34* (2006.01)
(52) U.S. Cl. ............... 204/192.29; 204/192.26; 204/192.15
(58) Field of Classification Search ............ 204/192.29, 204/192.26, 192.15
See application file for complete search history.

(56) References Cited

U.S. PATENT DOCUMENTS

| 5,225,273 A * | 7/1993 | Mikoshiba et al. ........... 428/323 |
| 6,617,056 B1 * | 9/2003 | Hara et al. .................. 428/697 |
| 6,908,666 B2 * | 6/2005 | Sasa et al. .................... 428/220 |
| 2001/0019244 A1* | 9/2001 | Yamazaki et al. ........... 313/506 |

FOREIGN PATENT DOCUMENTS

| JP | 01-100260 A | 4/1989 |
| JP | 03-015536 B2 | 3/1991 |
| JP | 08-064034 A | 3/1996 |

OTHER PUBLICATIONS

"Enhanced Electrical Conductivity of Indium Tin Oxide Films by Ag Addition", Jpn. J. Appl. Phys. vol. 37. 37 (1998) pp. 34-38 Part, 1, No. 1, Jan. 1998.*
"Physics of very thin ITO conducting films with high transparency prepared by DC magnetron sputtering", Thin Solid Films 270 (1995) pp. 37-42.*

* cited by examiner

*Primary Examiner*—Rodney G McDonald
(74) *Attorney, Agent, or Firm*—Sughrue Mion, PLLC

(57) ABSTRACT

A process for producing a transparent conductive laminate having a completely crystallized, transparent conductive layer on a substrate comprising an organic polymer molding is provided. The transparent conductive layer is excellent in transparency and wet heat confidence, is not excessively low in specific resistivity, and has no variation on optical properties such as retardation characteristic. The transparent conductive laminate is obtained by sputter-film forming a transparent conductive layer on a substrate comprising an organic polymer molding under conditions of a substrate temperature of 80-150° C. and a degree of vacuum of $8\times10^{-3}$ Pa or lower to form an amorphous transparent conductive layer comprising an In.Sn composite oxide having an amount of Sn atom of 1-6 % by weight based on the total weight of In atom and Sn atom and having a film thickness of 15-30 nm, a Hall mobility of 15-28 $cm^2$ V·S, and a carrier density of $2\times10^{20}/cm^3$ to $5\times10^{20}/cm^3$, and heat treating the layer at a temperature lower than 120° C., to convert it into a completely crystallized transparent conductive layer having a Hall mobility of 30-45 $cm^2/V\cdot S$ and a carrier density of $2\times10^{20}/cm^3$ to $7\times10^{20}/cm^3$.

2 Claims, No Drawings

PROCESS FOR PRODUCING TRANSPARENT CONDUCTIVE LAMINATE

FIELD OF THE INVENTION

The present invention relates to a process for producing a transparent conductive laminate comprising a substrate comprising an organic polymer molding and a transparent conductive layer comprising an In.Sn composite oxide, formed on the substrate.

DESCRIPTION OF THE RELATED ART

Such kinds of transparent conductive laminates are widely utilized as transparent electrodes for inorganic electroluminescent elements, transparent electrodes for electromagnetic radiation shields, transparent electrodes for analog/digital touch panels, and the like. Especially, in recent years, with the information infrastructure and the rapid diffusion of portable communication assistants represented by personal digital assistant (PDA), a demand for utilization of touch panels is rapidly spreading.

Such a touch panel of portable communication assistant is set on a liquid crystal display screen and can be subjected to graphic input by an exclusive pen in place of a keyboard, thereby enabling to display liquid crystals directly under a transparent input section. A person can recognize the information of the displayed liquid crystals through the touch panel as a transparent input element. In recent years, as the image quality of the liquid crystals of the portable communication assistant becomes sharp, a transparent electrode layer for touch panel to be set thereon is demanded to have high transparency.

Hitherto, transparent electrode laminates to be used for such utilization have been prepared by vapor deposition, ion plating, sputtering, or the like. From the standpoint of controllability and reproducibility, the sputtering is most generally employed. The sputtering is a method in which by using an oxide target identical with a film composition of a transparent conductive layer to be formed on a substrate, or metal target made of an In—Sn alloy, an inert gas (such as Ar gas) is introduced singly or together with a reactive gas (such as oxygen gas) to form a transparent conductive layer made of an In.Sn composite oxide on the substrate by sputter film formation. However, in the case where the substrate is made of an organic polymer molding, the film cannot be fabricated at high temperature because of poor heat resistance of the substrate, and immediately after the film formation, an amorphous film is partly crystallized in the resulting film. For this reason, the film product involved problems such that the transparency of the film is poor, yellowing of the film is highly observed, and that the change in resistivity after the wet heat test is large.

In order to overcome these problems, as means for forming a crystallized film on a substrate made of an organic polymer molding, JP-B-3-15536 proposes a technology in which a film is fabricated while reducing the amount of oxygen, and the resulting film is post-heated in an oxygen atmosphere in air to convert an amorphous film into a crystallized film. This proposed process gives rise to advantages such that the transparency of the film is enhanced, the yellowing does not occur, and that the change in resistivity after the wet heat test is small, so that the wet heat confidence is enhanced.

However, according to the above-described process of performing the post-heating, crystallization is not completed within a short period of time, but long-term heating at high temperature is required. For this reason, the productivity is poor due to a problem in product quality, such as formation of oligomers in the substrate film. Further, there was a problem that a specific resistivity of the resulting crystallized film is too low, thereby increasing a consumed electric power. Further, when the substrate is used as an optical substrate such as a retardation film, optical characteristics such as retardation characteristics undesirably greatly change due to the above-described post-heating.

SUMMARY OF THE INVENTION

Under these circumstances, an object of the invention is to provide a process for producing a transparent conductive laminate comprising a substrate comprising an organic polymer molding having formed thereon a completely crystallized, transparent conductive layer which is free from deteriorations in productivity and product quality, is excellent in transparency and wet heat confidence, is not too low in specific resistivity, and has optical characteristics such as retardation characteristics substantially unchanged from those before a heat treatment, by sputter film formation at a substrate temperature of 150° C. or lower, at which the substrate can thoroughly withstand, and then heat treating the film at low temperature for a short period of time.

The term "completely crystallized" as referred to herein means a state in which crystallized grains are present over the entire surface of the film by observation with a transmission electron microscope (TEM).

As a result of extensive and intensive investigations to achieve the above-described object, it has been found that in sputter film-forming a transparent conductive layer comprising an In·Sn composite oxide on a substrate comprising an organic polymer molding at a temperature of 80 to 150° C., which is a practically allowable heating temperature of the substrate, when the transparent conductive layer having a specified film thickness is formed by sputtering under conditions that the content of Sn in a target is low, an atmosphere where evacuation is performed to a prescribed degree of vacuum, thereby eliminating the moisture and impurities such as organic gases generated from the substrate, is employed, and that an oxygen gas is introduced thereinto together with an Ar gas, the transparent conductive layer immediately after the film formation is an amorphous film, but when the resulting film is heat-treated in air at low temperature of lower than 120° C., the film can be easily converted into a completely crystallized film without causing deteriorations in productivity and material quality.

Moreover, the completely crystallized film by the above specified heat treatment increased in its Hall mobility from 15-30 $cm^2/V·S$ before the heat treatment to 30-45 $cm^2/V·S$ after the heat treatment, but did not greatly change in a carrier density, i.e., the carrier density before the heat treatment was $2 \times 10^{20}/cm^3$ to $5 \times 10^{20}/cm^3$, and the carrier density after the heat treatment was $2 \times 10^{20}/cm^3$ to $7 \times 10^{20}/cm^3$. In contrast, the crystallized film obtained by long-term post-heat treatment at high temperature after the sputter film-formation as proposed by JP-B-3-15536 has a Hall mobility of 18 to 20 $cm^2/V·S$ and a carrier density of $5 \times 10^{21}/cm^3$ to $9 \times 10^{21}/cm^3$.

In summary, the completely crystallized film by the above specified heat treatment has peculiar properties such that the Hall mobility is about two times higher and that the carrier density is lower by one order, as compared with the crystallized film as proposed by the above-cited patent (JP-B-3-15536). Further, it has also been found that based on these properties, the completely crystallized film is excellent in transparency and wet heat confidence as a transparent conductive film and that its reduction in specific resistivity is limited only to about a half of that before the heat treatment (i.e., immediately after the sputter film formation) so that an excessive reduction of the specific resistivity is prevented as compared with the crystallized film as proposed by the above-cited patent (JP-B-3-15536), in which the specific resistivity is reduced by more than one order after the post-heat treatment, and that an increase in consumed electric power can be suppressed.

Further, it has also been found that by the above-described specific heat treatment, that is, a heat treatment at low temperature lower than 120° C., when using as an optical substrate such as a retardation film, optical characteristics such as retardation characteristics do not greatly change, and thus, excellent optical characteristics can be maintained.

The present invention has been completed based on these findings.

Accordingly, the present invention provides a process for producing a transparent conductive laminate, which comprises:

(a) a step of sputter film-forming a transparent conductive layer comprising an In.Sn composite oxide on a substrate comprising an organic polymer molding, and (b) a step of subsequent post-heating to produce a transparent conductive laminate having the transparent conductive layer on the substrate, wherein the step (a) is a step in which a metal target or an oxide target having an amount of Sn atom of 1-6% by weight based on the total weight of In atom and Sn atom is used, evacuation is performed to a degree of vacuum of $8\times10^{-3}$ Pa or lower at a substrate temperature of 80-150° C., an oxygen gas is introduced thereinto together with an Ar gas, and sputter film formation is conducted to form an amorphous transparent conductive layer comprising an In.Sn composite oxide having an amount of Sn atom of 1-6% by weight based on the total weight of In atom and Sn atom and having a film thickness of 15-30 nm, a Hall mobility of 15-28 cm$^2$/V·S, and a carrier density of $2\times10^{20}$/cm$^3$ to $5\times10^{20}$/cm$^3$ on the substrate; and the step (b) is a step in which the amorphous transparent conductive layer formed in the step (a) is subjected to heat treatment at a temperature lower than 120° C., to convert it into a completely crystallized transparent conductive layer having a Hall mobility of 30-45 cm$^2$/V·S and a carrier density of $2\times10^{20}$/cm$^3$ to $7\times10^{20}$/cm$^3$.

DETAILED DESCRIPTION OF THE INVENTION

The substrate used in the invention comprises an organic polymer molding, and organic polymer having excellent transparency and heat resistance are preferably used. Examples of such an organic polymer include polyester-based polymers such as polyethylene terephthalate; polyolefin-based polymers; norbornene-based polymers; homopolymers such as polycarbonates, polyether sulfones, and polyarylates; copolymers; and epoxy-based polymers. Such an organic polymer is molded into a film-like form, a sheet-like form, or other forms and then provided for the use. If desired, the molding may be provided with an undercoat or a back-side coat. Further, birefringent layers comprising liquid crystal monomers or liquid crystal polymers may be formed on the substrates.

In the step (a), a transparent conductive layer comprising an In.Sn composite oxide is formed on the substrate by sputter film formation. This film formation can use not only a standard magnetron sputtering process using a DC power source but also various sputtering processes such as an RF sputtering process, an (RF+DC) sputtering process, a pulse sputtering process, and a dual magnetron sputtering process. In sputter film-forming, the substrate temperature must be within the range of 80-150° C. in order to not thermally damage the substrate. By selecting a higher substrate temperature within this specified range, good results for crystallization of the transparent conductive layer to be formed can be obtained. Usually, the substrate temperature is set at about 100° C.

The sputter target used in the invention is a metal target (In—Sn target) or an oxide target (In$_2$O$_3$—SnO$_2$ target), having an amount of Sn of 1-6% by weight, preferably 2-5% by weight, based on the total weight of In atom and Sn atom. Addition of Sn contributes to enhancement of confidence such as durability of the film. However, so far as the crystallization is concerned, In$_2$O$_3$ is most likely crystallized. Exclusive of the amount of Sn to be incorporated into the In$_2$O$_3$ crystal lattices, Sn acts as an impurity to suppress the crystallization. For this reason, the amount of Sn must be controlled within the above-specified range.

In conducting the sputter film formation using such a target, the inside of a sputtering device is first evacuated to a degree of vacuum of $8\times10^{-3}$ Pa or less, and preferably $1\times10^{-3}$ Pa or less, to prepare an atmosphere from which moisture within the device and organic gases generated from the substrate have been eliminated. The reason for this is that during the film formation, the presence of the moisture or organic gases terminates a dangling bond generated during the film formation to suppress the crystal growth.

Next, an oxygen gas as a reactive gas is introduced together with an Ar gas as an inert gas into the thus evacuated sputtering device, and the sputter film formation is performed. During the sputter film formation, the film thickness of the transparent conductive layer should be in the range of 15-30 nm, and particularly preferably 20-25 nm. When the film thickness of the transparent conductive layer is less than 15 nm, the crystallization hardly occurs by the heat treatment in the subsequent step, whereas when it exceeds 30 nm, the specific resistivity excessively decreases by the heat treatment, so that the consumed electric power for the touch panel electrodes is liable to increase.

The transparent conductive layer formed by sputtering on the substrate is an amorphous film comprising an In.Sn composite oxide having an amount of Sn atom of 1-6% by weight based on the total weight of In atom and Sn atom and having a film thickness of 15-30 nm, in which the Hall mobility is 15-28 cm$^2$/V·S, and the carrier density is $2\times10^{20}$/cm$^3$ to $5\times10^{20}$/cm$^3$.

In the case where the transparent conductive laminate of the invention is utilized for touch panels, it is subjected to pattern etching processing with an acid. The pattern etching process is carried out at a stage immediately after the sputter film formation, namely at a stage before the heat treatment. After the heat treatment, the film is completely crystallized so that the etching processing is difficult. On the other hand, before the heat treatment, the film is an amorphous film so that the etching processing can be easily carried out.

In the subsequent step (b), the transparent conductive layer after the sputter film formation is subjected to heat treatment in air at low temperature. That is, the heat treatment is carried out at a temperature of lower than 120° C. by properly using a dryer, etc. The relationship between heating temperature and heating time desirably has, for example, a relationship shown in Table 1 below.

TABLE 1

| Heating Temperature (° C.) | Heating Time(hour) | |
| --- | --- | --- |
| | Maximum Value | Minimum Value |
| 110 | 22.2 | 2 |
| 100 | 47 | 3.4 |
| 90 | 99.5 | 5.6 |
| 80 | 210.7 | 9.2 |

TABLE 1-continued

| Heating Temperature (° C.) | Heating Time(hour) | |
| --- | --- | --- |
| | Maximum Value | Minimum Value |
| 70 | 446 | 15.1 |
| 60 | 944.3 | 24.9 |
| 50 | 1999 | 41 |
| 40 | 4231.9 | 67.7 |
| 30 | 8958.9 | 111.6 |

By selecting the heating temperature and the heating time as shown in Table 1 above, the film can be converted into a completely crystallized film without deterioration of productivity or material quality. That is, by appropriately selecting the heating time, even when the heat treatment is carried out at a temperature lower than 120° C., preferably at a temperature of 80° C. or lower, the above-described effect can be achieved. In this case, concerning optical characteristics such as retardation characteristics as an optical substrate, good characteristics can maintain unchanged from those before the heat treatment.

According to the heat treatment in the step (b), the amorphous film after the sputter film formation in the step (a) is converted into a completely crystallized film having a Hall mobility of a larger value of 30-45 cm$^2$/V·S and a carrier density of substantially the same value of $2 \times 10^{20}$/cm$^3$ to $7 \times 10^{20}$/cm$^3$. This Hall mobility is about two times higher as compared with that of the crystallized film proposed by the above-cited patent (JP-B-3-15536), and this carrier density is lower by approximately one order as compared with that of the crystallized film as proposed by the above-cited patent (JP-B-3-15536).

In general, it is said that donors generated by carrier electrons of a transparent conductive layer comprising an In.Sn composite oxide include an oxygen-deficient portion of an In$_2$O$_3$ fluorite crystal lattice and a portion where Sn atom substitutes in the In atom site.

In the invention, since the doping amount of Sn is low, the amount of the Sn atom substituted in the In atom site is low. Accordingly, it may be considered that this matter is a cause to make the carrier density low. Further, in the invention, the content of excessive Sn functioning as an impurity and the content of moisture are low. Accordingly, it may also be considered that in spite of the heat treatment at low temperature for a short period of time, this matter is a cause to largely grow the crystals, thereby making the Hall density large.

As described above, the transparent conductive layer after the heat treatment has peculiar properties (i.e., novel Hall mobility and carrier density) as a transparent conductive layer to be provided on a substrate comprising an organic polymer molding, which have not hitherto been reported. Especially, it can be said that the transparent conductive layer after the heat treatment of the invention is a completely crystallized film where crystals grow very well.

For this reason, the transparent conductive layer after the heat treatment exhibits excellent transparency such that light transmittance at 550 nm is enhanced by from about 1.5 to 4% as compared with that before the heat treatment. Especially, the enhancement in the light transmittance at a wavelength side shorter than 550 nm is remarkable. Further, the transparent conductive layer after the heat treatment does not exhibit a yellowing phenomenon and is low in the change of resistivity in the wet heat test, so that it is excellent in wet heat confidence. Moreover, in the transparent conductive layer after the heat treatment, the specific resistivity is about a half value of that before the heat treatment, and reduction rate of the specific resistivity by the heat treatment is low. Thus, an increase in the consumed electric power as touch panel electrodes can be prevented.

Further, when the substrate is the optical substrate such as a retardation film, since the heat treatment in the step (b) is carried out at low temperature lower than 120° C., preferably at a temperature of 80° C. or lower, there appears no great change in the optical characteristics such as retardation characteristics due to the heat treatment, and the excellent optical characteristics unchanged from those before the heat treatment can be maintained. Further, for instance, even when a liquid crystalline material is provided on the substrate, the liquid crystalline material does not receive an adverse effect during the heat treatment, and as a result, a good quality can be maintained.

The present invention is described in more detail by reference to the following Examples, but it should be understood that the invention is not construed as being limited thereto.

To compare the process of the present invention with the conventional process, Examples 1 and 2 should be compared with Comparative Examples 1 and 2, respectively.

Example 1

An In—Sn metal target (amount of Sn atom: 3% by weight based on the total weight of In atom and Sn atom) as a target material and a polyethylene terephthalate (hereinafter referred to as "PET") film having a thickness of 23 μm as a substrate were installed in a rolling up-type magnetron sputtering device of parallel plate type. The device was subjected to dehydration and degassing and evacuated to a degree of vacuum of $8 \times 10^{-4}$ Pa while rolling up.

In this state, sputter film formation was carried out by a reactive sputtering process with a 5 kW DC by introducing 600 sccm of an Ar gas by heating at a substrate temperature of 110° C. and by setting a plasma emission intensity of In by only the Ar gas at 90 and then regulating an amount of an oxygen gas introduced while opening and closing an automatic piezo valve such that the emission intensity after the introduction of oxygen gas became 35 by a plasma emission monitor (PEM), to adjust the film quality.

There was thus formed a 20 nm thick transparent conductive layer made of a transparent In.Sn composite oxide (hereinafter referred to as "ITO") on the substrate made of the PET film. The transparent conductive layer was then subjected to heat treatment by heating at 70° C. for 48 hours to prepare a transparent conductive laminate. With respect to this laminate, the transparent conductive layer was observed by a transmission electron microscope (TEM) (magnification: 25,000 times). As a result, it was observed that the completely crystallized ITO film was formed.

Further, with respect to this transparent conductive laminate, the Hall mobility and carrier density before the heat treatment (immediately after the sputter film formation) and after the heat treatment were measured by the Hall effect measurement. The measurement was carried out using a "HL5500PC" measurement system manufactured by BIO RAD. In addition, the resistivity, the light transmittance at 550 nm, and the resistivity five minutes after immersion in a 5% HCl aqueous solution were measured before and after the heat treatment. The results obtained are shown in Table 2 below.

TABLE 2

| | Before heat treatment | After heat treatment |
| --- | --- | --- |
| Hall mobility (cm$^2$/V · S) | 21.2 | 36.9 |
| Carrier density (number/cm$^3$) | $3.7 \times 10^{20}$ | $2.9 \times 10^{20}$ |

TABLE 2-continued

|  | Before heat treatment | After heat treatment |
|---|---|---|
| Resistivity (Ω/square) | 450 | 265 |
| Light transmittance (%) | 86 | 87.5 |
| Resistivity five minutes after immersion in 5% HCl aqueous solution (Ω/square) | ∞ | 265 |

As is clear from the above results, nevertheless the transparent conductive layer was a thin film having a thickness of 20 nm, which should have been originally hardly crystallized, it was well crystallized by the heat treatment at low temperature (70° C.) for 48 hours, so that the light transmittance at 550 nm was enhanced by 1.7% as compared with that before the heat treatment. Further, the reduction in the resistivity after the heat treatment was suppressed to a half of that before the heat treatment, so that there is no anxiety that the resistivity becomes excessively low by the heat treatment.

Moreover, before the heat treatment, the resistivity five minutes after the immersion in a 5% HCl aqueous solution is indefinite (∞), i.e., the film can be easily subjected to etching processing with an acid. On the other hand, after the heat treatment, any change was not found at all in the resistivity five minutes after the immersion in a 5% HCl aqueous solution, and hence, it is difficult to undergo the etching processing with an acid. In other words, the resulting film is stable against the acid.

Still further, separately from the above tests, the transparent conductive laminate after the heat treatment was subjected to wet heat test at 60° C. and at 90% RH for 500 hours. As a result, the change rate in resistivity against the initial resistivity before the test (265 Ω/square) was suppressed to 1.1 times. Therefore, the transparent conductive laminate after the heat treatment was also excellent in wet heat confidence.

Comparative Example 1

The sputter film formation was carried out in the same manner as in Example 1, except for changing the target material to an In—Sn metal target (amount of Sn atom: 10% by weight based on the total weight of In atom and Sn atom). There was thus formed a 20 nm thick transparent conductive layer made of an ITO film on a substrate made of a PET film. This transparent conductive layer was then subjected to heat treatment by heating at 70° C. for 24 hours to prepare a transparent conductive laminate.

With respect to this transparent conductive laminate, the Hall mobility and carrier density before the heat treatment (immediately after the sputter film formation) and after the heat treatment were measured in the same manner as described above. In addition, the resistivity, the light transmittance at 550 nm, and the resistivity five minutes after immersion in a 5% HCl aqueous solution were measured before and after the heat treatment. The results obtained are shown in Table 3 below.

TABLE 3

|  | Before heat treatment | After heat treatment |
|---|---|---|
| Hall mobility (cm$^2$/V·S) | 18.0 | 28.0 |
| Carrier density (number/cm$^3$) | $3.5 \times 10^{20}$ | $3.2 \times 10^{20}$ |
| Resistivity (Ω/square) | 500 | 400 |

TABLE 3-continued

|  | Before heat treatment | After heat treatment |
|---|---|---|
| Light transmittance (%) | 86.0 | 86.5 |
| Resistivity five minutes after immersion in 5% HCl aqueous solution (Ω/square) | ∞ | ∞ |

As is clear from the above results, an enhancement in the light transmittance before and after the heat treatment was not substantially found; and the resistivity five minutes after the immersion in a 5% HCl aqueous solution was also indefinite (∞) even after the heat treatment. Hence, although the etching processing with an acid could be performed, the resulting film was poor in stability against an acid in proportion thereto.

Separately from the above tests, the transparent conductive laminate after the heat treatment was subjected to wet heat test in the same manner as described above. As a result, the change rate in resistivity against the initial resistivity before the test became 1.5 times. Therefore, the transparent conductive laminate after the heat treatment was poor in wet heat confidence as compared with that in Example 1.

Example 2

An In—Sn oxide target (amount of Sn atom: 4.7% by weight based on the total weight of In atom and Sn atom) as a target material and as a substrate a polycarbonate film having a thickness of 50 μm and a phase of 137 nm to a wavelength of 55 nm, obtained by uniaxially stretching a polycarbonate at 160° C. were installed in a rolling up-type magnetron sputtering device of parallel plate type. The device was subjected to dehydration and degassing and evacuated to a degree of vacuum of $5 \times 10^{-3}$ Pa while rolling up.

In this state, sputter film formation was carried out in a reactive sputtering process with a 5 kW DC by introducing 600 sccm of an Ar gas by heating at a substrate temperature of 100° C. and by regulating an amount of an oxygen gas introduced with a mass flow controller so as to be a given resistance vale.

There was thus formed a 20 nm-thick transparent conductive layer made of a transparent ITO film on the substrate made of the polycarbanate film. The transparent conductive layer was then subjected to heat treatment by heating at 70° C. for 24 hours to prepare a transparent conductive laminate. With respect to this laminate, the transparent conductive layer was observed by a transmission electron microscope. As a result, the completely crystallized ITO film was formed.

Further, with respect to this transparent conductive laminate, the Hall mobility and carrier density before the heat treatment (immediately after the sputter film formation) and after the heat treatment were measured in the same manner as described above. In addition, the resistivity, the light transmittance at 550 nm, and the resistivity five minutes after immersion in a 5% HCl aqueous solution were measured before and after the heat treatment. In-plane retardation ($\Delta n_d$) was a value obtained measuring a retardation at 550 nm by an automatic birefringentometer (trade name: KOBRA 21 ADH, manufactured by Oji Keisoku Kiki Co.). Those results are shown in Table 4 below.

TABLE 4

|  | Before heat treatment | After heat treatment at 70° C. for 24 hours |
|---|---|---|
| Hall mobility (cm$^2$/V·S) | 26.1 | 31.5 |
| Carrier density (number/cm$^3$) | 4.7 × 10$^{20}$ | 5.7 × 10$^{20}$ |
| Resistivity (Ω/square) | 290 | 200 |
| Light transmittance (%) | 86 | 87 |
| Resistivity five minutes after immersion in 5% HCl aqueous solution (Ω/square) | ∞ | 200 |
| Δn$_d$ (at 550 nm) | 137 | 136 |

As is apparent from the above results, the properties other than the in-plane retardation were substantially the same results as in Example 1. Further, the in-plane retardation after heat treatment did not show any great change as compared with that before heat treatment, and was the substantially the same value as that before heat treatment.

Moreover, separately from the above tests, the transparent conductive laminate after the heat treatment was subjected to wet heat test in the same manner as described above. As a result, the transparent conductive laminate after the heat treatment was excellent in wet heat confidence as in Example 1.

Comparative Example 2

The sputter film formation was carried out in the same manner as in Example 2, except that the target material was changed to an In—Sn oxide target (amount of Sn atom: 9.5% by weight based on the total weight of In atom and Sn atom), the evacuation was performed to a degree of vacuum of 5×10$^{-3}$ Pa, and the amount of oxygen gas introduced was regulated so as to obtain a predetermined resistance value. There was thus formed a 20 nm thick transparent conductive layer made of an ITO film on a substrate made of a polycarbonate film. This transparent conductive layer was then subjected to heat treatment by heating at 70° C. for 24 hours to prepare a transparent conductive laminate.

With respect to this transparent conductive laminate, the Hall mobility and carrier density before the heat treatment (immediately after the sputter film formation) and after the heat treatment were measured in the same manner as described above. In addition, the resistivity, the light transmittance at 550 nm, the resistivity five minutes after immersion in a 5% HCl aqueous solution, and the in-plane retardation (Δn$_d$) were measured before and after the heat treatment. The results obtained are shown in Table 5 below.

TABLE 5

|  | Before heat treatment | After heat treatment At 70° C. for 24 hours |
|---|---|---|
| Hall mobility (cm$^2$/V·S) | 20 | 27 |
| Carrier density (number/cm$^3$) | 2.9 × 10$^{20}$ | 2.6 × 10$^{20}$ |
| Resistivity (Ω/square) | 550 | 400 |
| Light transmittance (%) | 86 | 86.5 |
| Resistivity five minutes after immersion in 5% HCl aqueous solution (Ω/square) | ∞ | ∞ |
| Δn$_d$ (at 550 nm) | 137 | 136 |

As is clear from the above results, an enhancement in the light transmittance before and after the heat treatment was not substantially found; and the resistivity five minutes after the immersion in a 5% HCl aqueous solution was also indefinite (∞) even after the heat treatment. Hence, although the etching processing with an acid could be performed, the resulting film was poor in stability against an acid in proportion thereto.

Separately from the above tests, the transparent conductive laminate after the heat treatment was subjected to wet heat test in the same manner as described above. As a result, the change rate in resistivity against the initial resistivity (400 Ω/square) before the test became 2.0 times. Therefore, the transparent conductive laminate after the heat treatment was poor in wet heat confidence as compared with that in Example 2.

In the light of the above, according to the invention, in sputter film formation of a transparent conductive layer comprising an In.Sn composite oxide on a substrate comprising an organic polymer molding at a practically allowable heating temperature of the substrate, when the transparent conductive layer having a film thickness of from 15 to 50 nm is formed by sputtering under conditions that the content of Sn in a target is low, an atmosphere where evacuation is performed to a prescribed degree of vacuum, thereby eliminating the moisture and impurities such as organic gases generated from the substrate, is employed, and that an oxygen gas is introduced thereinto together with an Ar gas, and the resulting film is heat treated under specific conditions, a transparent conductive laminate having a completely crystallized, transparent conductive layer, which does not cause deteriorations in productivity and material quality, is excellent in transparency and wet heat confidence, is not excessively low in specific resistivity, and has no variation on optical properties such as retardation characteristic, can be obtained.

It should further be apparent to those skilled in the art that various changes in form and detail of the invention as shown and described above may be made. It is intended that such changes be included within the spirit and scope of the claims appended hereto.

This application is based on Japanese Patent Application No. 2003-306586 filed Aug. 29, 2003, the disclosure of which is incorporated herein by reference in its entirety.

What is claimed is:

1. A process for producing a transparent conductive laminate, which comprises:
   (a) a step of sputter film-forming a transparent conductive layer comprising an In.Sn composite oxide on a substrate comprising an organic polymer molding, and
   (b) a step of subsequent post-heating to produce a transparent conductive laminate having the transparent conductive layer on the substrate,
   wherein the step (a) is a step in which a metal target or an oxide target having an amount of Sn atom of 1-6% by weight based on the total weight of In atom and Sn atom is used, evacuation is performed to a degree of vacuum of 8×10$^{-3}$ Pa or lower at a substrate temperature of 80-150° C., an oxygen gas is introduced thereinto together with an Ar gas, and sputter film formation is conducted to form an amorphous transparent conductive layer comprising an In.Sn composite oxide having an amount of Sn atom of 1-6% by weight based on the total weight of In atom and Sn atom and having a film thickness of 15-30 nm, a Hall mobility of 15-28 cm$^2$/V·S, and a carrier density of 2×10$^{20}$/cm$^3$ to 5×10$^{20}$/cm$^3$ on the substrate; and
   the step (b) is a step in which the amorphous transparent conductive layer formed in the step (a) is subjected to heat treatment at a temperature of 70° C. or less, to convert it into a completely crystallized transparent conductive layer having a Hall mobility of 30-45 cm$^2$/V·S and a carrier density of 2×10$^{20}$/cm$^3$ to 7×10$^{20}$/cm$^3$.

2. The process according to claim 1, wherein the step (a) is performed under a condition that a degree of vacuum is 8×10$^{-4}$ Pa or less.

* * * * *